(12) United States Patent
Wu et al.

(10) Patent No.: US 12,464,935 B2
(45) Date of Patent: Nov. 4, 2025

(54) DISPLAY PANEL WITHOUT POLARIZER AND MANUFACTURING METHOD THEREOF

(71) Applicants: CHANGSHA HKC OPTOELECTRONICS CO., LTD., Changsha (CN); HKC CORPORATION LIMITED, Shenzhen (CN)

(72) Inventors: Kerong Wu, Changsha (CN); Rongrong Li, Changsha (CN)

(73) Assignees: CHANGSHA HKC OPTOELECTRONICS CO., LTD., Changsha (CN); HKC CORPORATION LIMITED, Shenzhen (CN)

( * ) Notice: Subject to any disclaimer, the term of this patent is extended or adjusted under 35 U.S.C. 154(b) by 426 days.

(21) Appl. No.: 18/069,199

(22) Filed: Dec. 20, 2022

(65) Prior Publication Data

US 2023/0217792 A1 Jul. 6, 2023

(30) Foreign Application Priority Data

Dec. 31, 2021 (CN) .......................... 202111678337.4

(51) Int. Cl.
*H10K 59/80* (2023.01)
*H10K 59/12* (2023.01)
(Continued)

(52) U.S. Cl.
CPC ......... *H10K 59/8792* (2023.02); *H10K 59/38* (2023.02); *H10K 77/10* (2023.02);
(Continued)

(58) Field of Classification Search
CPC .. H10K 59/8792; H10K 59/38; H10K 59/126; H10K 77/10
(Continued)

(56) References Cited

U.S. PATENT DOCUMENTS

2016/0226030 A1 8/2016 Heo
2018/0188606 A1* 7/2018 Lee .................. G02F 1/133512
(Continued)

FOREIGN PATENT DOCUMENTS

| CN | 103268736 | 8/2013 |
|---|---|---|
| CN | 103500753 | 1/2014 |

(Continued)

OTHER PUBLICATIONS

CNIPA, First Office Action for CN Application No. 202111678337.4, Jun. 27, 2022.
(Continued)

*Primary Examiner* — Nduka E Ojeh
(74) *Attorney, Agent, or Firm* — Hodgson Russ LLP

(57) ABSTRACT

A display panel includes a transparent substrate and a light emitting function layer and a color resist layer formed on the transparent substrate. The transparent substrate has a light emitting region and a non-light emitting region. The light-emitting functional layer is located at a side of the transparent substrate and includes a transistor and an organic light emitting device. The transistor is formed on the non-light-emitting region. The color resist layer is located on a side of the transparent substrate away from the light-emitting function layer. The color resist layer includes a black matrix formed on the non-light-emitting region and a color filter formed on the light-emitting region. Light emitted by the organic light-emitting device is emitted through the light-emitting region of the transparent substrate and the color filter in sequence.

19 Claims, 3 Drawing Sheets

(51) Int. Cl.
  *H10K 59/38* (2023.01)
  *H10K 71/20* (2023.01)
  *H10K 77/10* (2023.01)
  *H10K 102/00* (2023.01)

(52) U.S. Cl.
  CPC ......... *H10K 59/1201* (2023.02); *H10K 71/20* (2023.02); *H10K 2102/302* (2023.02)

(58) Field of Classification Search
  USPC .......................................................... 257/40
  See application file for complete search history.

(56) References Cited

U.S. PATENT DOCUMENTS

| | | | |
|---|---|---|---|
| 2020/0119101 A1* | 4/2020 | Lee | H10K 59/878 |
| 2021/0202592 A1* | 7/2021 | Kim | H10K 59/87 |

FOREIGN PATENT DOCUMENTS

| | | |
|---|---|---|
| CN | 104076549 | 10/2014 |
| CN | 106992149 | 7/2017 |
| CN | 207602574 | 7/2018 |
| CN | 111029388 | 4/2020 |
| CN | 111261681 | 6/2020 |
| CN | 111293148 | 6/2020 |
| CN | 111430414 | 7/2020 |
| CN | 112420782 | 2/2021 |
| CN | 113097269 | 7/2021 |
| WO | 2021164467 | 8/2021 |

OTHER PUBLICATIONS

CNIPA, First Office Action for CN Application No. 202111678337.4, Aug. 3, 2022.
CNIPA, Notification to Grant Patent Right for Invention for CN Application No. 202111678337.4, Oct. 10, 2022.

* cited by examiner

DISPLAY PANEL WITHOUT POLARIZER AND MANUFACTURING METHOD THEREOF

CROSS-REFERENCE TO RELATED APPLICATIONS

This application claims priority to Chinese Patent Application No. 202111678337.4, filed Dec. 31, 2021, the entire disclosure of which is incorporated herein by reference.

FIELD OF TECHNOLOGY

The disclosure relates to the field of display, more particularly, to a display panel and a manufacturing method of the display panel.

BACKGROUND

AMOLED (Active-matrix organic light-emitting diode) display panel is self-luminous, theoretically, polarizers are not needed, but because AMOLED cathode and the substrate is lined with a variety of metal traces, making AMOLED substrate looks like a silver light-emitting tin foil, so in the ambient light irradiation, the panel will reflect lights because of the traces and lead to a significant decline in display effect and contrast.

Therefore, at present, the AMOLED display panel adopts a relatively special circular polarizer to reduce reflection, i.e., the light becomes vertically polarized when it is incident inside the polarizer and horizontally polarized when it is reflected, so it cannot pass through the polarizer and reflect back to the human eye. That is to say, the purpose of polarizer on AMOLED panels is to reduce reflection.

A light-emitting mode commonly used by the conventional large-size panel is a bottom light-emitting technology combining a white-light organic light-emitting layer and a color film substrate, white light generated by the organic light-emitting layer passes through a light-emitting region and is converted into red, green and blue light by the color film substrate, the red, green and blue light is emitted by an array substrate and a polarizer to generate an image, however, a TFT transistor layer of metal will be reflected back to the external ambient light. Therefore, the polarizer is also needed to reduce the reflection and reduce the transmittance of the light-emitting area.

SUMMARY

There are provided a display panel according to embodiments of the present disclosure. The technical solution is as below:

According to a first aspect of embodiments of the present disclosure, there is provided a display panel, including: a transparent substrate having a light-emitting region and a non-light-emitting region; and a light-emitting function layer and a color resist layer formed on the transparent substrate, the light-emitting function layer being located at a side of the transparent substrate and comprising a transistor and an organic light-emitting device, the transistor being formed on the non-light-emitting region, a part of the organic light-emitting device being formed on the light-emitting region, and another part of the organic light-emitting device being formed on the non-light-emitting region and connected to the transistor;

the color resist layer is located on a side of the transparent substrate away from the light-emitting function layer, and the color resist layer includes a black matrix formed on the non-light-emitting region and a color filter formed on the light-emitting region, wherein light emitted by the organic light-emitting device is emitted through the light-emitting region of the transparent substrate and the color filter in sequence.

According to a second aspect of embodiments of the present disclosure, there is provided a manufacturing method of a display panel, including:

providing a transparent substrate having a light-emitting region and a non-light-emitting region;

forming a light-emitting function layer on one side of the transparent substrate, comprising:

forming a transistor on one side of the transparent substrate and on the non-light-emitting region; and forming an organic light-emitting device on one side of the transparent substrate, wherein a part of the organic light-emitting device being formed on the light-emitting region, and another part of the organic light-emitting device being formed on the non-light-emitting region and connected to the transistor; and forming a black matrix and a color resist layer on a side of transparent substrate away from the light-emitting function layer, wherein a black matrix is within the non-light-emitting region, and a color filter formed is within the light-emitting region;

wherein light emitted by the organic light-emitting device is emitted through the light-emitting region of the transparent substrate and the color filter in sequence.

It should be understood that the above general description and the following detailed description are exemplary and explanatory only and are not intended to limit the present disclosure.

BRIEF DESCRIPTION OF THE DRAWINGS

The accompanying drawings which are incorporated in and constitute a part of the description illustrate embodiments consistent with the disclosure and together with the description serve to explain the principles of the disclosure. It will be apparent that the drawings described below are only some embodiments of the present disclosure, and other drawings may be obtained from them without creative effort for those of ordinary skill in the art.

DETAILED DESCRIPTION OF THE EMBODIMENTS

Exemplary embodiments will now be described more comprehensively with reference to the accompanying drawings. However, the exemplary embodiments can be implemented in a variety of forms and should not be construed as being limited to the examples set forth herein. Rather, these embodiments are provided so that the present disclosure will be more comprehensive and complete, and the concept of exemplary embodiments will be fully communicated to those skilled in the art.

It should be noted that "on . . . ", "formed on . . . " and "disposed on . . . " mentioned herein can mean that one layer is directly formed or provided on another layer, or that one layer is indirectly formed or provided on another layer, that is, there are other layers between the two layers.

In the present disclosure, the terms "first", "second" are used for descriptive purposes only and are not to be construed as indicating or implying relative importance or as implying the number of technical features indicated. Thus, the features defined as "first" or "second" may be explicitly or implicitly defined as including one or more of the features. In the description of the present disclosure, "a plurality of" means two or more, unless explicitly and specifically defined otherwise.

In this disclosure, unless otherwise stated, the term "co-layered" is used to indicate that two layers, components, members, elements, or portions may be formed by the same patterning process and that the two layers, components, member, elements, or portions are generally formed of the same material.

In this disclosure, unless otherwise stated, the expression "patterning process" generally includes applying photoresist, exposing, developing, etching, stripping of photoresist, etc. The expression "one patterning process" refers to the process of forming patterned layers, parts, components, etc. using a single mask.

Further, the described features, structures or characteristics may be incorporated in any suitable manner in one or more embodiments. In the following description, many specific details are provided to give a full understanding of the embodiments of the present disclosure. However, those skilled in the art will appreciate that one or more of the technical solutions of the present disclosure may be practiced without particular details, or other methods, group elements, devices, steps, etc. may be employed. In other instances, well-known methods, devices, implementations or operations are not shown or described in detail to avoid obscuring aspects of the present disclosure.

Embodiment 1

Figure 1:
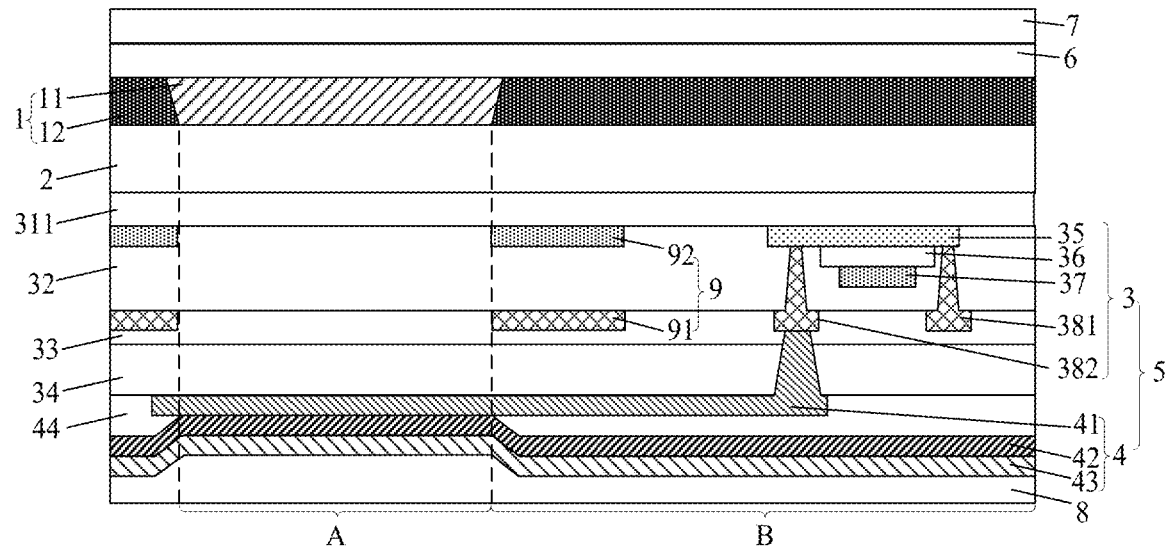
FIG. 1 shows a schematic diagram of a first display panel according to embodiment 1 of the present disclosure.
Figure 2:
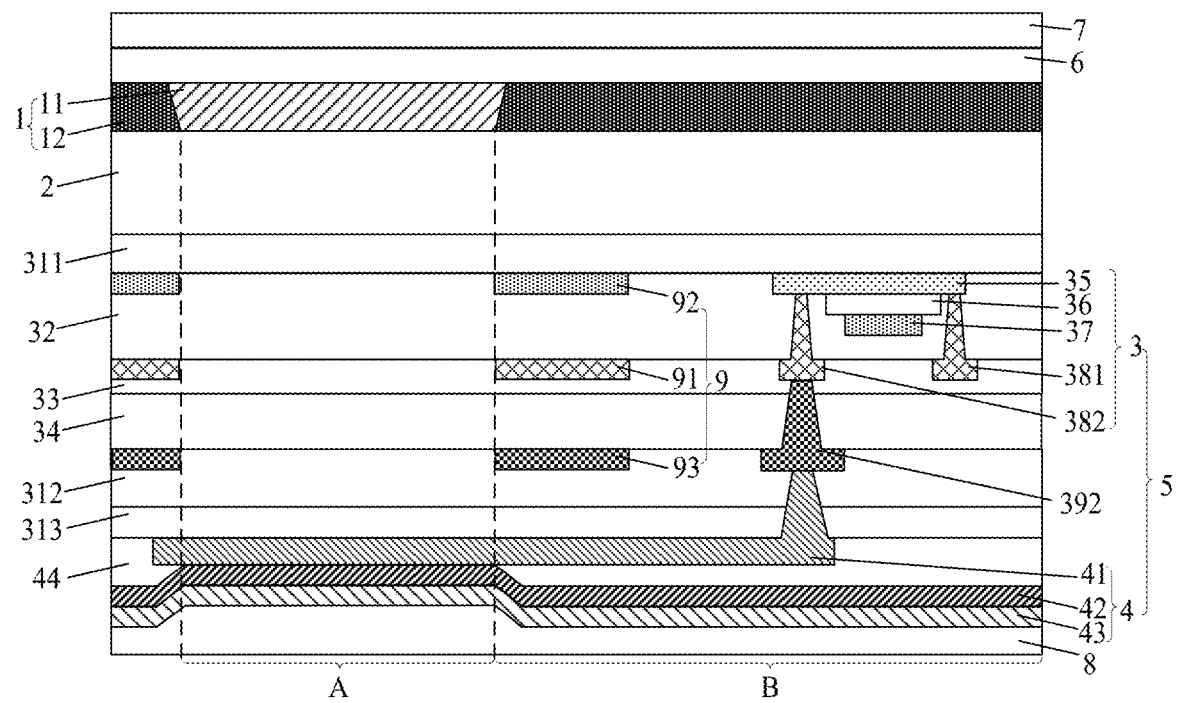
FIG. 2 shows a schematic diagram of a second display panel according to embodiment 1 of the present disclosure.
Figure 3:
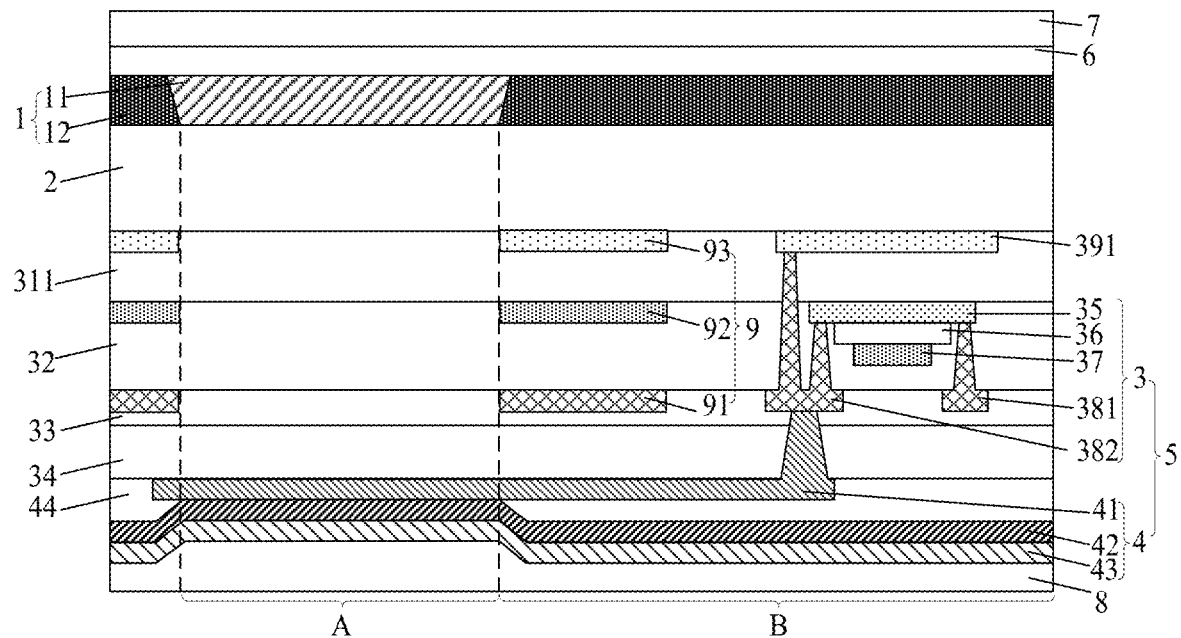
FIG. 3 shows a schematic diagram of a third display panel according to embodiment 1 of the present disclosure.

As shown in FIGS. 1-3, the embodiment of the present disclosure provides a display panel, which includes a transparent substrate 2, a light-emitting function layer 5 and a color resist layer 1 formed on the transparent substrate 2. The light-emitting function layer 5 is located on a side of the transparent substrate 2, and the color resist layer 1 is located on a side of the transparent substrate 2 away from the light-emitting function layer 5.

Specifically, the transparent substrate 2 has good light transmittance, which is conducive to improving the light transmittance of the display panel, thereby improving the display effect. The transparent substrate 2 may be made of glass. The transparent substrate 2 has a light-emitting region A and a non-light-emitting region B.

The light-emitting function layer 5 includes a transistor 3 formed on the non-light-emitting region B and an organic light-emitting device 4 which is partly formed on the light-emitting region A and partly formed on the non-light-emitting region B and connected to the transistor 3. That is, the display panel described in this embodiment may be an OLED (Organic Light-Emitting Diode) display panel, specifically an AMOLED display panel.

The configuration of the transistor 3 will be described in detail below.

As shown in FIGS. 1-3, in the present embodiment, the transistor 3 may be of a top gate type, and the transistor 3 may include an active layer 35, a gate insulating layer 36, a gate 37, an interlayer dielectric layer 32, a source 382, and a drain 381. Specifically, the active layer 35 may be formed on the buffer layer 311, the gate insulating layer 36 covers the active layer 35, and the gate 37 is formed on the side of the gate insulating layer 36 away from the active layer 35, that is, the active layer 35 of the transistor 3 is located on the side of the gate 37 close to the transparent substrate 2. The interlayer dielectric layer 32 covers the gate 37, the gate insulating layer 36 and the active layer 35. The source 382 and the drain 381 are formed on a side of the interlayer dielectric layer 32 facing away from the transparent substrate 2 and on opposite sides of the gate 37, respectively, and can be contacted with opposite sides of the active layer 35 through vias (e.g., a metal via), respectively. The interlayer dielectric layer 32 also covers the through vias. It should be understood that the transistor can also be of a bottom gate type.

For example, the material of the gate 37 may include metallic or alloy materials, including, for example, molybdenum, aluminum and titanium. The source 382 and the drain 381 may include metallic or alloy materials, such as a metallic monolayer or multilayer structure formed by molybdenum, aluminum and titanium, etc. For example, the multi-layer structure is a multi-metal layer stack, such as a titanium, aluminum, titanium three-layer metal stack (Al/Ti/Al). The material of the active layer 35 may be an oxide, for example, a metal oxide material such as IZGO (Indium Gallium Zinc Oxide), which has high precision, high electron mobility, low power consumption and high touch performance, may be adopted.

In this embodiment, a passivation layer 33 and a planarizing layer 34 are further provided between the transistor 3 and the organic light-emitting device 4. The material of the passivation layer 33 may be an inorganic material such as silicon nitride or silicon oxide. The planarizing layer 34 may have a single-layer structure or a multi-layer structure; The planarizing layer 34 may be made of an organic material such as a photoresist, an acrylic-based polymer, a silicon-based polymer or the like.

The organic light-emitting device 4 includes an anode 41 and a cathode 43 and a light-emitting layer 42 therebetween. In addition, the organic light-emitting device also includes a pixel define unit 44. The pixel define unit 44 may cover the planarizing layer 34, and a portion of the pixel define unit 44 located in the light-emitting region A may have a pixel opening exposing the anode 41. In addition, the organic light-emitting device 4 may further include function layers such as an electron injection layer, an electron transport layer, a hole injection layer, a hole transport layer and the like in different examples depending on actual needs.

The anode 41 may be made of indium tin oxide (ITO), indium zinc oxide (IZO), zinc oxide (ZnO) and the like. The cathode 43 may be made of a metal material such as lithium (Li), aluminum (Al), magnesium (Mg), and silver (Ag). The light-emitting layer 42 may include a small molecule organic material or a polymer molecule organic material, may be a fluorescent light-emitting material or a phosphorescent light-emitting material, may emit red light, green light, blue light, may emit white light, or the like. The pixel define unit 44 may be made of an organic material such as a photoresist.

The anode 41 of the organic light-emitting device 4 is electrically connected to the source 382 of the transistor 3. Further, as shown in FIGS. 1 and 3, the anode 41 may be electrically connected directly to the source 382. Alternatively, as shown in FIG. 2, the anode 41 may be electrically connected to the source 382 through the via electrode 392. The via electrode 392 may be made of a metallic material so that the via electrode is located in the non-light-emitting region B.

The color resist layer 1 includes a black matrix 12 formed on a non-light-emitting region B and a color filter 11 formed on a light-emitting region A. The black matrix 12 can absorb external light while blocking the reflected light of the transistor 3 to prevent the reflected light from affecting the display effect. Different color filters 11 can filter light of different colors, such as red light, green light and blue light, thereby displaying a color picture.

The light emitted from the organic light-emitting device 4 is emitted through the light-emitting region A of the transparent substrate 2 and the color filter 11 in sequence. That is, in this embodiment, the light emitted by the organic light-emitting device 4 needs to pass through the pixel openings between the adjacent transistors 3, and therefore the display panel is a bottom-emitting display panel.

In the present disclosure, the color resist layer 1 and the light-emitting function layer 5 are arranged on both sides of the transparent substrate 2, respectively. Specifically, the light-emitting function layer 5 can be understood as being located on the light entering side of the transparent substrate 2, the color resist layer 1 can be understood as being located on the light output side of the transparent substrate 2. That is to say, the light emitted by the organic light-emitting device 4 in the light-emitting function layer 5 can be emitted through the transparent substrate 2 and the color resist layer 1 in sequence. By arranging the color resist layer 1 on the light output side of the transparent substrate 2, the black matrix 12 of the color resist layer 1 can be used to block the metal traces of the light-emitting function layer 5, e.g., block metal structures such as the source 382, the drain 381, the via electrode 392, the gate 37, the light-shielding metal portion 391, and the cathode 43 of the light-emitting function layer 5. Compared with a solution for reducing light reflection by using a polarizer, the solution has the advantages that the light reflection of the metal structures to the external ambient light, and the polarizer is not needed, so that the transmissivity of the panel is improved, and the cost is saved.

As shown in FIGS. 1-3, the display panel further includes a reflective structure 9 formed on the non-light-emitting region B, which can reflect light to the light-emitting region A, reduce the consumption of light by the non-light-emitting region B, and enable more light to be emitted from the color filter 11, thereby improving the light transmittance and further improving the display effect.

At least one reflective side of the reflective structure 9 is aligned with a junction of the black matrix 12 and the color filter 11. In this way, light can be further reflected without affecting the light-emitting area, light loss can be reduced, and light utilization can be further improved, that is, more light can be emitted from the color filter, and the display effect can be improved.

By way of example, the reflective structure 9 may be located on the side of the transparent substrate 2 away from the color resist layer 1. For example, the reflective structure 9 may belong to the aforementioned light-emitting function layer 5.

The reflective structure 9 is arranged in the same layer as at least one of the gate 37, the source and the drain of the transistor 3. Thus, it is beneficial to improve the space utilization of the light-emitting function layer 5, thereby reducing the thickness of the display panel and simplifying the production steps.

It should be understood that the reflective structure 9 may also be located in the non-light-emitting region B between the transparent substrate 2 and the color resist layer 1, which can also improve the light utilization.

The reflective structure 9 is located on the side of the transparent substrate 2 away from the color resist layer 1, which will be described in detail below.

As shown in FIG. 1, the reflective structure 9 includes a first reflective layer 91 and a second reflective layer 92.

The first reflective layer 91 is provided in the same layer as the source 382 and the drain 381, that is, the first reflective layer 91 may be formed simultaneously with the source 382 and the drain 381 in one patterning process. Accordingly, the material of the first reflective layer 91 may be the same as that of the source 382 and the drain 381. The second reflective layer 92 is provided in a same layer as the gate 37, that is, the second reflective layer 92 and the gate 37 may be formed simultaneously in one patterning process, and accordingly, the material of the second reflective layer 92 may be the same as that of the gate 37. In this way, it is beneficial to simplify the production process and reduce the process difficulty.

At least one reflective side of at least one of the first reflective layer 91 and the second reflective layer 92 is aligned with the junction of the black matrix 12 and the color filter 11. In this embodiment, each of the first reflective layer 91 and the second reflective layer 92 has a reflective side that is aligned with the junction of the black matrix 12 and the color filter 11, so that more reflected light is concentrated and emitted from the color filter 11.

The light-emitting function layer 5 further includes a storage capacitor. The first reflective layer 91 and the second reflective layer 92 are disposed opposite to each other and insulated from each other, the first reflective layer 91 constituting a first electrode plate of the storage capacitor, the second reflective layer 92 constituting a second electrode plate of the storage capacitor, and the interlayer dielectric layer 32 constituting a dielectric layer of the storage capacitor. That is, in this embodiment, the first reflective layer 91 and the second reflective layer 92 are used not only to reflect light to the light-emitting region A, but also to constitute the storage capacitor. In this way, no other electrode plates can be formed to constitute the storage capacitor, thereby facilitating the reduction of the space occupied by the non-light-emitting region B, increasing the aperture ratio and increasing the light transmittance.

In other embodiments, the first reflective layer 91 and the second reflective layer 92 may also be used only for reflecting light. The storage capacitor is composed of other electrodes, and further, the electrodes of the storage capacitor may be opaque electrodes, and the opaque electrodes are arranged in the non-light-emitting region B. The electrode plate of the storage capacitor can also be a transparent electrode plate, and the transparent electrode plate is arranged in the light-emitting region A. When the electrode plate of the storage capacitor is a transparent electrode plate, it is also beneficial to reduce the space occupied by the non-light-emitting region B, thereby improving the aperture ratio.

As shown in FIGS. 2-3, the reflective structure 9 further includes a third reflective layer 93, at least one reflective side of the third reflective layer 93 is aligned with the junction of the black matrix 12 and the color filter 11, and the third reflective layer 93 constitutes a third electrode plate of the storage capacitor. It should be understood that as the plate area of the storage capacitor is increased, the storage capacity of the storage capacitor is correspondingly increased.

The position of the third reflective layer 93 will be described in detail below.

In example 1, referring to FIG. 2, the third reflective layer 93 is located on a side of the first reflective layer 91 away from the second reflective layer 92 and is disposed opposite to and insulated from the first reflective layer 91. That is, the first reflective layer 91 and the second reflective layer 92 constitute one capacitor, and the second reflective layer 92 and the third reflective layer 93 constitute another capacitor.

A first planarizing layer 312 and a second planarizing layer 313 may also be provided between the third reflective layer 93 and the anode 41.

In the case described in example 1, the display panel may further include the via electrode 392 located on the non-light-emitting region B and used to electrically connect the anode 41 of the organic light-emitting device 4 and the source 382 of the transistor 3, thereby facilitating reduction of the contact resistance to improve the light-emitting effect of the organic light-emitting device 4. In other examples, the display panel may not have the via electrode 392.

Further, the via electrode 392 and the third reflective layer 93 are provided in a same layer, i.e., they can be formed by one patterning process, thereby facilitating simplification of the production process.

In example 2, referring to FIG. 3, the third reflective layer 93 is located on a side of the second reflective layer 92 away from the first reflective layer 91 and is disposed opposite to and insulated from the second reflective layer 92. That is, the first reflective layer 91 and the second reflective layer 92 constitute one capacitor, and the second reflective layer 92 and the third reflective layer 93 constitute another capacitor.

In the case described in example 1, the display panel may further include a light-shielding metal portion 391 that is located on the non-light-emitting region B and on the side of the active layer 35 close to the transparent substrate 2, and the light-shielding metal portion 391 is insulated from the active layer 35 and shields the active layer 35. The light-shielding metal portion 391 can further reduce the influence of light reflection on the active layer 35, thereby improving the electrical performance and stability of the transistor 3.

Further, the light-shielding metal portion 391 and the third reflective layer 93 are provided in a same layer, i.e., they can be formed by one patterning process, thereby facilitating simplification of the production process. In other examples, the light-shielding metal portion 391 may not be provided.

As shown in FIGS. 1-3, the display panel may further include an anti-reflection coating 6 located on the side of the color resist layer 1 away from the transparent substrate 2. The anti-reflection coating 6 is beneficial to further improve the light transmittance, thereby improving the display effect.

The display panel may also include a protective film 7 located on a side of the color resist layer 1 away from the transparent substrate 2. The protective film 7 can protect the color resist layer 1, so as to prolong the service life of the color resist layer 1.

The display panel may also include a metal packaging layer 8 located on a side of the light-emitting function layer 5 away from the transparent substrate 2. The metal packaging layer 8 is used to protect the light-emitting function layer 5 to prolong the service life of the light-emitting function layer 5. In addition, the metal packaging layer 8 can also be used for electrical connection with external devices.

In summary, the color resist layer 1 in this embodiment can reduce light reflection and improve light transmittance, thereby improving contrast and display effect.

In addition, at least one reflective side of the reflective structure 9 is aligned with the junction of the black matrix 12 and the color filter 11, which facilitates the concentrated reflection of light to the light-emitting region A, thereby reducing the loss of light and improving the utilization of light. In addition, the first reflective layer 91, the second reflective layer 92, and the third reflective layer 93 are also used to construct the storage capacitor, so that no other electrode plates can be formed to construct the storage capacitor, which is beneficial to reducing the space area occupied by the non-light-emitting region B.

Embodiment 2

Figure 4:
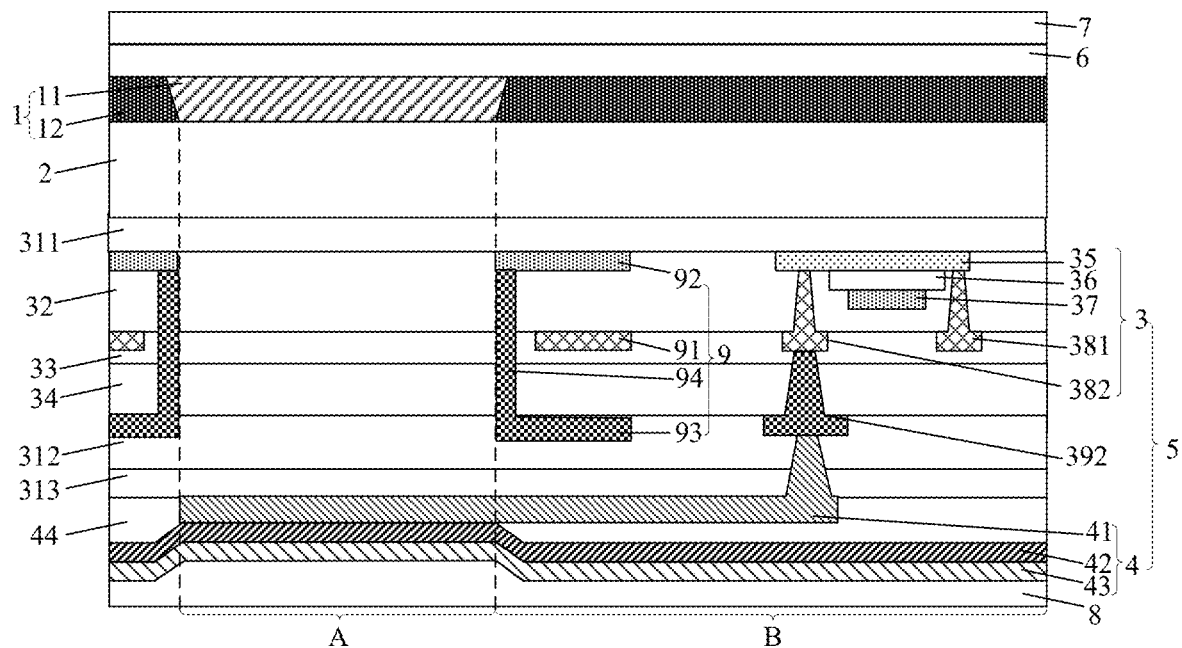
FIG. 4 shows a schematic diagram of the first display panel according to embodiment 2 of the present disclosure.
Figure 5:
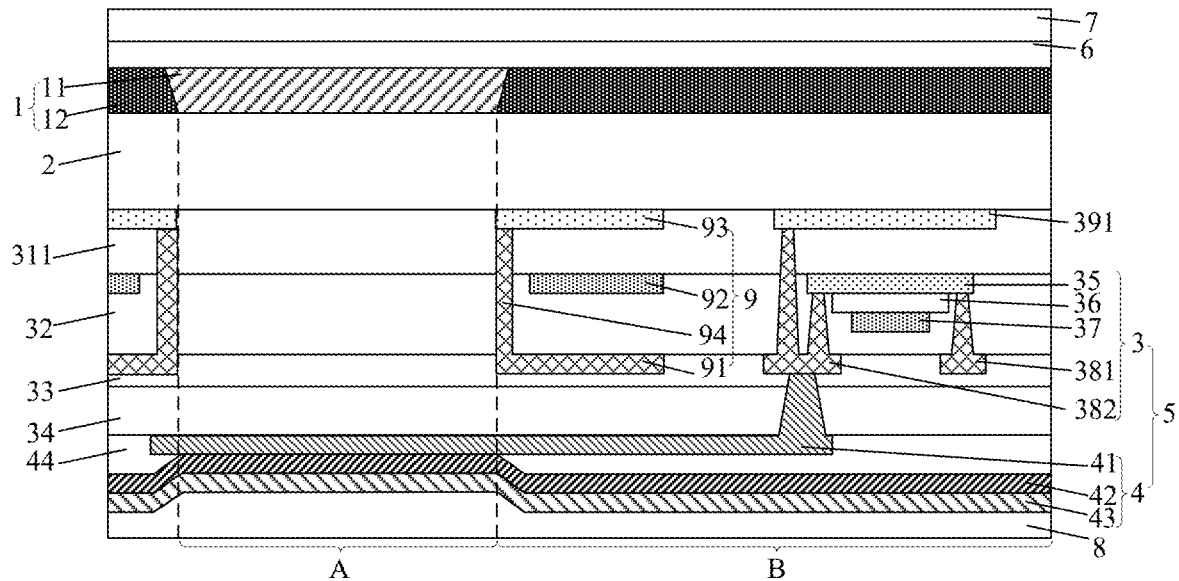
FIG. 5 shows a schematic diagram of the second display panel according to embodiment 2 of the present disclosure.

As shown in FIGS. 4-5, this embodiment provides a display panel. The difference between this embodiment and embodiment 1 is that the reflective structure 9 further includes a reflective column 94, and at least one reflective side of the reflective column 94 is aligned with the junction of the black matrix 12 and the color filter 11. The same or similar parts of this embodiment and embodiment 1 are referred to the detailed description of the preceding embodiments and will not be repeated here.

The reflective column 94 can increase the reflective area, thereby forming a light transmission channel so that the light is concentrated and emitted from the light-emitting region A. In this way, the display effect and contrast can be further improved.

The relative positional relationship between the reflective column 94 and each reflective layer will be explained by example below.

As shown in FIG. 4, in the case where the third reflective layer 93 is located on the side of the first reflective layer 91 away from the second reflective layer 92 and is opposite to and insulated from the first reflective layer 91, the reflective column 94 and the third reflective layer 93 are arranged in a same layer and connected, that is, the reflective column 94 can be formed in the same patterning process as the third reflective layer 93.

The reflective column 94 penetrates at least an insulating layer between the third reflective layer 93 and the second reflective layer 92 and is connected to the second reflective layer 92, and is also disconnected from the first reflective layer 91. That is, the reflective layer 94 penetrates the planarizing layer 34, the passivation layer 33 and the interlayer dielectric layer 32.

The third reflective layer 93 may also be provided in a same layer as the via electrode 392. That is the reflective column 94, the via electrode 392 and the third reflective layer 93 may be formed in the same patterning process.

As shown in FIG. 5, in the case where the third reflective layer 93 is located on the side of the second reflective layer 92 away from the first reflective layer 91 and is opposite to and insulated from the second reflective layer 92, the reflective structure 9 further includes the reflective column 94, which is arranged in a same layer as and connected to the first reflective layer 91, that is, the reflective column 94 can be formed in the same patterning process as the first reflective layer 91.

The reflective column 94 penetrates at least the insulating layer between the first reflective layer 91 and the third reflective layer 93. The reflective column 94 is connected to the third reflective layer 93 and is disconnected from the second reflective layer 92. That is, the reflective column 94 penetrates the buffer layer 311 and the interlayer dielectric layer 32.

The third reflective layer 93 may also be provided in a same layer as the light-shielding metal portion 391. That is, the reflective pillar 94, the light-shielding metal portion 391 and the third reflective layer 93 may be formed in the same patterning process.

In the above two examples, the reflective column 94 is connected to the two reflective layers. However, in other examples, the reflective column 94 may also be spaced from all the reflective layers. In other examples, the reflective column 94 may also be connected to only one reflective layer. In other examples, the reflective structure 9 may also include only the reflective column 94 but not the reflective layer, and accordingly the electrode plate of the storage capacitor may be provided as a transparent substrate and disposed in the light-emitting region A.

In addition, in this embodiment, the reflective side of the reflective structure 9 is arranged around the light-emitting region A, so that a continuous light channel can be formed to increase the reflective area to a greater extent, reduce the loss of light, and thereby improve the transmittance of light. In other embodiments, the reflective sides of the reflective structure 9 may also be located on opposite sides of the light-emitting region A.

In the present disclosure, the color resist layer and the light-emitting function layer are arranged on both sides of the transparent substrate, respectively. Specifically, the light-emitting function layer can be understood as being located on the light entering side of the transparent substrate, the color resist layer can be understood as being located on the light output side of the transparent substrate. That is to say, the light emitted by the organic light-emitting device in the light-emitting function layer can be emitted through the transparent substrate and the color resist layer in sequence. By arranging the color resist layer on the light output side of the transparent substrate, the black matrix of the color resist layer can be used to block the metal traces of the light-emitting function layer, e.g., block the transistors of the light-emitting function layer, the cathode of the organic light-emitting devices and other metal structures, etc. Compared with a solution for reducing light reflection by using a polarizer, the solution has the advantages that the light reflection of the metal structures to the external ambient light, and the polarizer is not needed, so that the transmissivity of the panel is improved, and the cost is saved.

Embodiment 3

Figure 6:
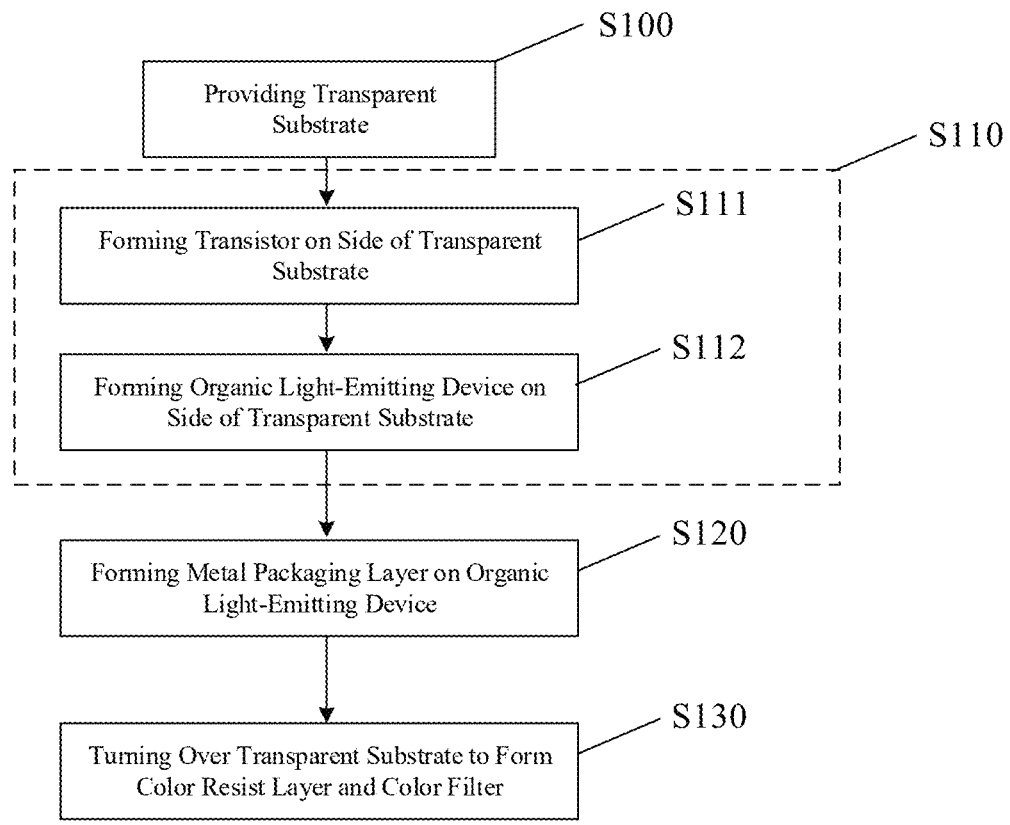
FIG. 6 shows a flowchart of a manufacturing method of a display panel according to embodiment 3 of the present disclosure.

As shown in FIG. 6, this embodiment provides a manufacturing method of a display panel, which can be used to manufacture the display panel described in embodiments 1 and 2. The manufacturing method includes step S100, step S110, step S120 and step S130.

In step S100, a transparent substrate is provided.

Specifically, the transparent substrate has a light-emitting region and a non-light-emitting region.

In step S110, a light-emitting function layer is formed on one side of the transparent substrate, the light-emitting function layer includes a transistor and an organic light-emitting device. Step S110 includes step S111 and step S112.

Step S111: a transistor is formed on one side of the transparent substrate.

Specifically, a buffer layer, an active layer, a gate insulating layer, a gate, an interlayer dielectric layer, a source, a drain, and a planarizing layer are sequentially arranged on the transparent substrate.

In some embodiments, the gate and the second reflective layer are formed using the same patterning process. The second reflective layer may constitute a second electrode plate of the storage capacitor.

In some embodiments, the source, the drain and the first reflective layer are formed using the same patterning process. The first reflective layer may constitute a first electrode plate of the storage capacitor.

It should be understood that before forming the buffer layer, a light-shielding metal portion may also be formed on the transparent substrate. After the planarizing layer is formed, a via electrode electrically connected to the source can also be formed.

Correspondingly, the light-shielding metal portion and the third reflective layer can be formed by the same patterning process. Alternatively, the via electrode and the third reflective layer may be formed by the same patterning process. The third reflective layer may constitute the third electrode plate of the storage capacitor.

In some embodiments, the light-shielding metal portion and the reflective column may also be formed using the same patterning process, and the reflective column connects the first reflective layer and the third reflective layer. Alternatively, the via electrode and the reflective column are formed by the same patterning process, and the reflective column connects the second reflective layer and the third reflective layer.

Thus, a reflective structure can be formed at the same time as the transistor is formed, and the reflective layer in the reflective structure can be used to form a storage capacitor.

Step S112: an organic light-emitting device is formed on one side of the transparent substrate.

Specifically, an anode, a pixel define unit, a light-emitting layer and a cathode may be formed in turn.

In step S120, a metal packaging layer is formed on the organic light-emitting device.

Specifically, the metal packaging layer can be formed by a process such as evaporation or sputtering.

In step S130, the transparent substrate is turned over to form a black matrix and a color filter.

Specifically, the color filter is formed in the light-emitting region, and the black matrix is formed in the non-light-emitting region.

To sum up, the color resist layer of this solution is no longer designed between the transistor and the organic light-emitting device, but after the transistor and the organic light-emitting device are finished and packaged, the transparent substrate is turned over to form the color resist layer and the color filter.

It should be noted that although the various steps of the method of the present disclosure are described in a particular order in the drawings, it is not required or implied that these steps must be performed in that particular order, or that all of the illustrated steps must be performed in order to achieve the desired results. Additionally or alternatively, certain steps may be omitted, a plurality of steps may be merged into one step for execution, and/or a step may be decomposed into a plurality of steps for execution, etc. Further, some of the above steps may be executed in parallel or sequentially and the like, and are not limited to the specific sequence of operations described above.

Embodiment 4

This embodiment provides a display device, which may include a display substrate described in the foregoing embodiments.

The specific type of the display device is not particularly limited. Types of display devices commonly used in the art can be used, such as OLED (Organic Light-Emitting Diode) display screens, mobile devices such as mobile phones, wearable devices such as watches, VR (Virtual Reality) devices. Those skilled in the art can make corresponding choices according to the specific uses of the display devices, and will not repeat them here.

In the description of this description, illustrations of the reference terms "some embodiments", "exemplified", etc. mean that specific features, structures, materials, or features described in connection with the embodiment or example are included in at least one embodiment or example of the present disclosure. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may connect and combine different embodiments or examples described in this description and features of different embodiments or examples.

Although the embodiments of the present disclosure have been shown and described above, understandably, the above-described embodiments are exemplary and cannot be construed as limiting the present disclosure. Those of ordinary skill in the art may make changes, modifications, substitutions and modifications to the above-described embodiments within the scope of the present disclosure. Therefore, any changes or modifications made in accordance with the claims and descriptions of the present disclosure should fall within the scope of the present disclosure.

What is claimed is:

1. A display panel without a polarizer, comprising:
a transparent substrate having a light-emitting region and a non-light-emitting region; and
a light-emitting function layer formed on the transparent substrate and located at a side of the transparent substrate, comprising:
a transistor formed on the non-light-emitting region; and
an organic light-emitting device, a part of the organic light-emitting device being formed on the light-emitting region, and another part of the organic light-emitting device being formed on the non-light-emitting region and connected to the transistor; and
a color resist layer formed on the transparent substrate and located on a side of the transparent substrate away from the light-emitting function layer, wherein the color resist layer comprises:
a black matrix formed on the non-light-emitting region; and
a color filter formed on the light-emitting region,
wherein light emitted by the organic light-emitting device is emitted through the light-emitting region of the transparent substrate and the color filter in sequence;
wherein the display panel further comprises a reflective structure formed on the non-light-emitting region, and at least one reflective side of the reflective structure is aligned with a junction of the black matrix and the color filter.

2. The display panel without the polarizer according to claim 1, wherein the reflective structure is located on a side of the transparent substrate away from the color resist layer;
wherein the reflective structure is arranged in a same layer as at least one of a gate, a source and a drain of the transistor.

3. The display panel without the polarizer according to claim 2, wherein the reflective structure comprises a first reflective layer and a second reflective layer;
wherein the first reflective layer is disposed in a same layer as the source and the drain,
wherein the second reflective layer is disposed in a same layer as the gate,
wherein at least one reflective side of at least one of the first reflective layer and the second reflective layer is aligned with the junction of the black matrix and the color filter.

4. The display panel without the polarizer according to claim 3, wherein the light-emitting function layer further comprises a storage capacitor,
wherein the first reflective layer and the second reflective layer are arranged opposite to each other and insulated from each other, the first reflective layer forms a first electrode plate of the storage capacitor, and the second reflective layer forms a second electrode plate of the storage capacitor.

5. The display panel without the polarizer according to claim 4, wherein the reflective structure further comprises a third reflective layer, at least one reflective side of the third reflective layer being aligned with the junction of the black matrix and the color filter, and the third reflective layer forming a third electrode plate of the storage capacitor;
wherein the third reflective layer is located on a side of the first reflective layer away from the second reflective layer, and is opposite to and insulated from the first reflective layer; or
the third reflective layer is located on a side of the second reflective layer away from the first reflective layer, and is opposite to and insulated from the second reflective layer.

6. The display panel without the polarizer according to claim 5, wherein the reflective structure further comprises a reflective column, at least one reflective side of the reflective column is aligned with the junction of the black matrix and the color filter;
wherein in a case where the third reflective layer is located on the side of the first reflective layer away from the second reflective layer, and is opposite to and insulated from the second reflective layer, the reflective column is arranged in a same layer as the third reflective layer and connected to the third reflective layer, the reflective column at least penetrates an insulating layer between the third reflective layer and the second reflective layer and is connected to the second reflective layer, and further is disconnected from the first reflective layer; or
in a case where the third reflective layer is located on the side of the second reflective layer away from the first reflective layer, and is opposite to and insulated from the second reflective layer, the reflective structure further comprises the reflective column arranged in a same layer as the first reflective layer and connected to the first reflective layer, the reflective column at least penetrates an insulating layer between the first reflective layer and the third reflective layer, the reflective column is connected to the third reflective layer and is disconnected from the second reflective layer.

7. The display panel without the polarizer according to claim 5, wherein an active layer of the transistor is located on a side of the gate close to the transparent substrate, wherein the display panel further comprises a light-shielding metal portion located on the non-light-emitting region and on a side of the active layer close to the transparent substrate, wherein the light-shielding metal portion is insulated from the active layer and shields the active layer;
  wherein one of the source and the drain penetrates through a plurality of insulating layers and is connected to the light-shielding metal portion; and/or
  in a case where the third reflective layer is located on the side of the second reflective layer away from the first reflective layer, and is opposite to and insulated from the second reflective layer, the third reflective layer is disposed on a same layer as the light-shielding metal portion.

8. The display panel without the polarizer according to claim 1, wherein a reflective side of the reflective structure is disposed around the light-emitting region, or
  a reflective side of the reflective structure is located on opposite sides of the light-emitting region.

9. The display panel without the polarizer according to claim 1, wherein the display panel further comprises an anti-reflection coating located on a side of the color resist layer away from the transparent substrate.

10. The display panel without the polarizer according to claim 1, wherein the display panel further comprises a protective film located at a side of the color resist layer away from the transparent substrate.

11. The display panel without the polarizer according to claim 1, wherein the display panel further comprises a metal packaging layer located on a side of the light-emitting function layer away from the transparent substrate.

12. A manufacturing method of a display panel, comprising:
  providing a transparent substrate having a light-emitting region and a non-light-emitting region;
  forming a light-emitting function layer on one side of the transparent substrate, comprising:
  forming a transistor on one side of the transparent substrate and on the non-light-emitting region; and
  forming an organic light-emitting device on one side of the transparent substrate, wherein a part of the organic light-emitting device is formed on the light-emitting region, and another part of the organic light-emitting device is formed on the non-light-emitting region and connected to the transistor; and
  forming a black matrix and a color resist layer on a side of the transparent substrate away from the light-emitting function layer, wherein a black matrix is within the non-light-emitting region, and a color filter formed is within the light-emitting region;
  wherein light emitted by the organic light-emitting device is emitted through the light-emitting region of the transparent substrate and the color filter in sequence.

13. The manufacturing method of a display panel according to claim 12, wherein before the forming a black matrix and a color resist layer on a side of transparent substrate away from the light-emitting function layer, the method further comprises:
  forming a metal packaging layer on the organic light-emitting device.

14. The manufacturing method of a display panel according to claim 12, wherein the forming a transistor on one side of the transparent substrate and on the non-light-emitting region comprises:
  sequentially forming a buffer layer, an active layer, a gate insulating layer, a gate, an interlayer dielectric layer, a source, a drain, and a planarizing layer on the transparent substrate.

15. The manufacturing method of a display panel according to claim 14, wherein the gate and a second reflective layer are formed using the same patterning process, wherein the second reflective layer constitutes a second electrode plate of a storage capacitor.

16. The manufacturing method of a display panel according to claim 14, wherein the drain and a first reflective layer are formed using the same patterning process, wherein the first reflective layer constitutes a first electrode plate of a storage capacitor.

17. The manufacturing method of a display panel according to claim 16, wherein before the forming the buffer layer on the transparent substrate, the method further comprises:
  forming a light-shielding metal portion on the transparent substrate.

18. The manufacturing method of a display panel according to claim 17, wherein the light-shielding metal portion and a third reflective layer are formed by the same patterning process.

19. The manufacturing method of a display panel according to claim 18, wherein the light-shielding metal portion and a reflective column are formed by the same patterning process, wherein the reflective column connects the first reflective layer and the third reflective layer.

\* \* \* \* \*